(12) United States Patent
Shinohara

(10) Patent No.: US 10,818,724 B2
(45) Date of Patent: Oct. 27, 2020

(54) PHOTOELECTRIC CONVERSION DEVICE AND IMAGING SYSTEM

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/506,146

(22) Filed: Jul. 9, 2019

(65) Prior Publication Data

US 2020/0058700 A1   Feb. 20, 2020

(30) Foreign Application Priority Data

Aug. 17, 2018   (JP) .................................. 2018-153476

(51) Int. Cl.
*H01L 27/146*   (2006.01)
*H01L 27/148*   (2006.01)
*H01L 31/04*   (2014.01)

(52) U.S. Cl.
CPC .. *H01L 27/14812* (2013.01); *H01L 27/14614* (2013.01); *H01L 27/14616* (2013.01); *H01L 31/04* (2013.01)

(58) Field of Classification Search
CPC ......... H01L 27/14636; H01L 27/14612; H01L 27/14663; H01L 27/14692
USPC ......................................................... 257/72
See application file for complete search history.

(56) References Cited

U.S. PATENT DOCUMENTS

| 4,962,412 | A | 10/1990 | Shinohara |
| 5,008,206 | A | 4/1991 | Shinohara |
| 5,060,042 | A | 10/1991 | Shinohara |
| 5,086,326 | A | 2/1992 | Shinohara |
| 5,146,339 | A | 9/1992 | Shinohara |
| 5,280,358 | A | 1/1994 | Yushiya |
| 6,828,601 | B2 | 12/2004 | Shinohara |
| 6,876,019 | B2 | 4/2005 | Shinohara |
| 7,250,970 | B2 | 7/2007 | Shinohara |
| 7,394,492 | B2 | 7/2008 | Shinohara |
| 7,741,593 | B2 | 6/2010 | Iwata |

(Continued)

FOREIGN PATENT DOCUMENTS

| JP | 2001-108886 | 4/2001 |
| JP | 2010-522479 | 7/2010 |

(Continued)

*Primary Examiner* — Elias Ullah
(74) *Attorney, Agent, or Firm* — Venable LLP

(57) ABSTRACT

A photoelectric conversion device includes a photoelectric converter accumulating signal charge generated by photoelectric conversion in the first semiconductor region of a first conductivity type, a charge-to-voltage converter generating a voltage signal in accordance with amount of the signal charge, a transistor of a second conductivity type provided in a third semiconductor region of the first conductivity type and including a gate connected to the first semiconductor region, and a voltage supply circuit supplying voltage to the source and drain of the transistor. The voltage supply circuit supplies voltage that causes gate capacitance of the transistor to be a first capacitance value when signal charge accumulated in the first semiconductor region correspond to first amount and cause the gate capacitance to be a second capacitance value when signal charge accumulated in the first semiconductor region correspond to second amount.

19 Claims, 7 Drawing Sheets

(56) References Cited

U.S. PATENT DOCUMENTS

| | | |
|---|---|---|
| 7,821,551 B2 | 10/2010 | Shinohara |
| 7,884,870 B2 | 2/2011 | Shinohara |
| 8,063,966 B2 | 11/2011 | Shinohara |
| 8,139,133 B2 | 3/2012 | Iwane |
| 8,164,668 B2 | 4/2012 | Iida |
| 8,345,137 B2 | 1/2013 | Shinohara |
| 8,350,942 B2 | 1/2013 | Shinohara |
| 8,471,942 B2 | 6/2013 | Shinohara |
| 8,896,734 B2 | 11/2014 | Shinohara |
| 8,970,769 B2 | 3/2015 | Shinohara |
| 9,117,724 B2 | 8/2015 | Furukawa |
| 9,437,647 B2 | 9/2016 | Shinohara |
| 9,877,689 B2 | 1/2018 | Kawata |
| 2005/0253946 A1 | 11/2005 | Shinohara |
| 2008/0231727 A1 | 9/2008 | Compton |
| 2013/0215308 A1 | 8/2013 | Furukawa |
| 2016/0071893 A1 | 3/2016 | Shinohara |
| 2017/0214878 A1 | 7/2017 | Van Der Tempel |
| 2018/0184027 A1 | 6/2018 | Shinohara |
| 2019/0110013 A1 | 4/2019 | Shinohara |
| 2019/0198541 A1 | 6/2019 | Shinohara |
| 2019/0252432 A1 | 8/2019 | Onuki |

FOREIGN PATENT DOCUMENTS

| | | |
|---|---|---|
| JP | 2013-172279 | 9/2013 |
| JP | 2017-67634 | 4/2017 |
| JP | 2017-523688 | 8/2017 |
| WO | 2008/115500 | 9/2008 |
| WO | 2016/005332 | 1/2016 |

PHOTOELECTRIC CONVERSION DEVICE AND IMAGING SYSTEM

BACKGROUND OF THE INVENTION

Field of the Invention

The present invention relates to a photoelectric conversion device and an imaging system.

Description of the Related Art

Conventionally, a photoelectric conversion device including a photodiode that converts incident light into signal charge and accumulates the converted signal charge and configured to integrate, by integral circuits, the signal charge read via a switch connected to the photodiode and to output the integrated signal charge as a voltage signal is known. For example, Japanese Patent Application Laid-Open No. 2001-108886 discloses that such a photoelectric conversion device is used for automatic focusing of a camera. Further, Japanese Patent Application Laid-Open No. 2017-067634 discloses that such a photoelectric conversion device is used for X-ray detection.

As disclosed in Japanese Patent Application Laid-Open No. 2001-108886, for example, an integral circuit that integrates signal charge read from a photodiode is generally formed of an operational amplifier and a capacitor. Since a capacitor having no voltage dependency or no temperature dependency is usually used for an integral circuit, signal output of the integral circuit is superior in linearity and stability.

In the conventional configurations disclosed in Japanese Patent Application Laid-Open No. 2001-108886 and Japanese Patent Application Laid-Open No. 2017-067634, however, it is difficult to achieve both high S/N ratio and high dynamic range. That is, when p-n junction capacitance of a photodiode is increased, while the saturation charge amount can be increased in proportion to the p-n junction capacitance, so-called kTC noise increases in proportion to the ½ power of the p-n junction capacitance. Basically, sensitivity is independent of photodiode capacitance, and when p-n junction capacitance increases, while the S/N ratio decreases, the dynamic range becomes wider. Conversely, when p-n junction capacitance decreases, while the dynamic range becomes narrower, the S/N ratio increases.

SUMMARY OF THE INVENTION

The object of the present invention is to provide a photoelectric conversion device that can improve both the S/N ratio and the dynamic range.

According to an aspect of the present invention, there is provided a photoelectric conversion device including a photoelectric converter that includes a first semiconductor region of a first conductivity type and a second semiconductor region of a second conductivity type and accumulates signal charge generated by photoelectric conversion in the first semiconductor region, a charge-to-voltage converter that generates voltage signal in accordance with amount of the signal charge accumulated in the first semiconductor region, a first transistor of the second conductivity type that is provided in a third semiconductor region of the first conductivity type and includes a gate connected to the first semiconductor region, and a voltage supply circuit that supplies voltage to at least one of the source and the drain of the first transistor, wherein the voltage supply circuit supplies, to at least the one of the source and the drain, a voltage that causes gate capacitance of the first transistor to be first capacitance value when the signal charge accumulated in the first semiconductor region correspond to first accumulation amount and causes the gate capacitance to be a second capacitance value larger than the first capacitance value when the signal charge accumulated in the first semiconductor region correspond to second accumulation amount larger than the first accumulation amount.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
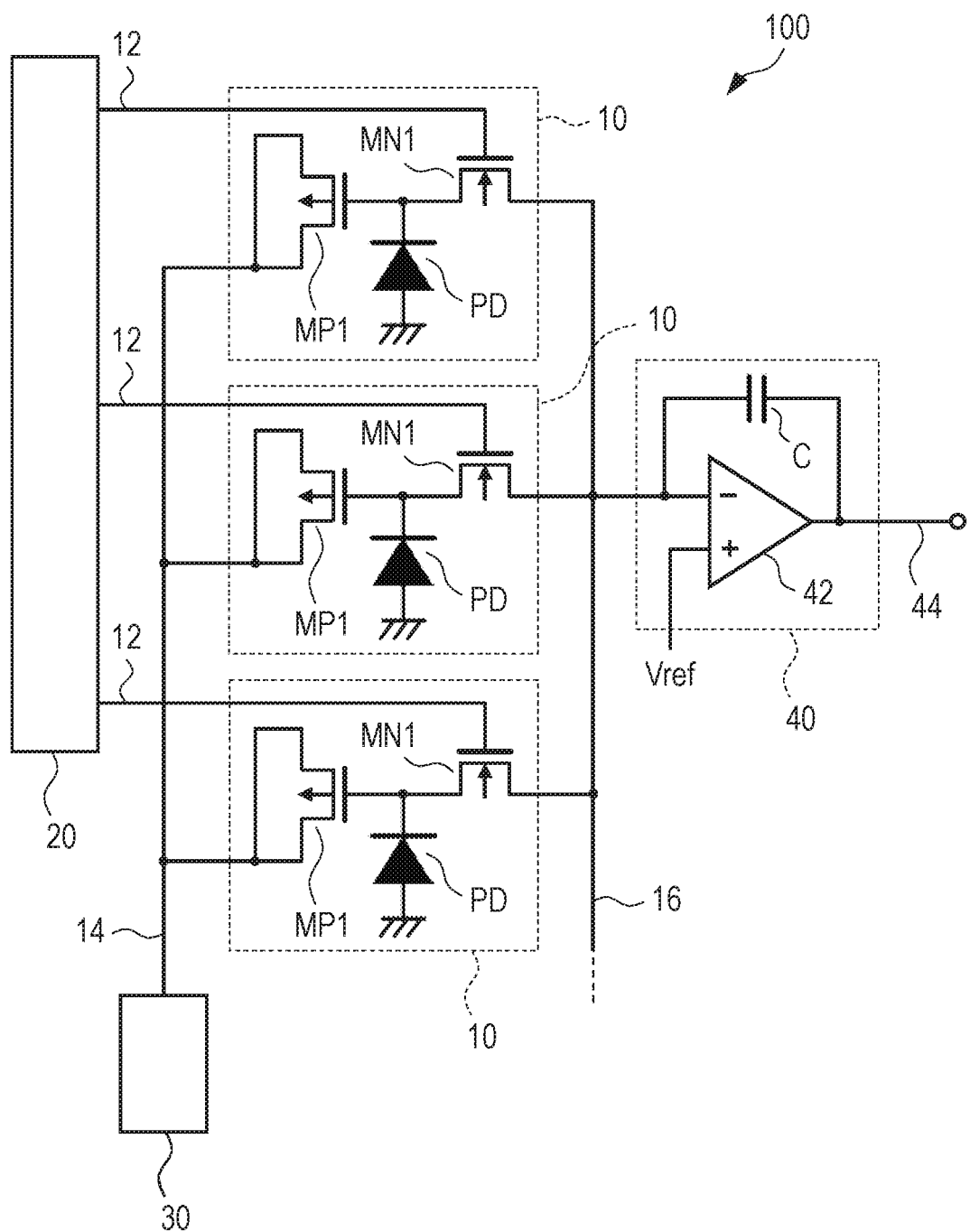
FIG. 1 is a circuit diagram illustrating the general configuration of a photoelectric conversion device according to a first embodiment of the present invention.
Figure 2:
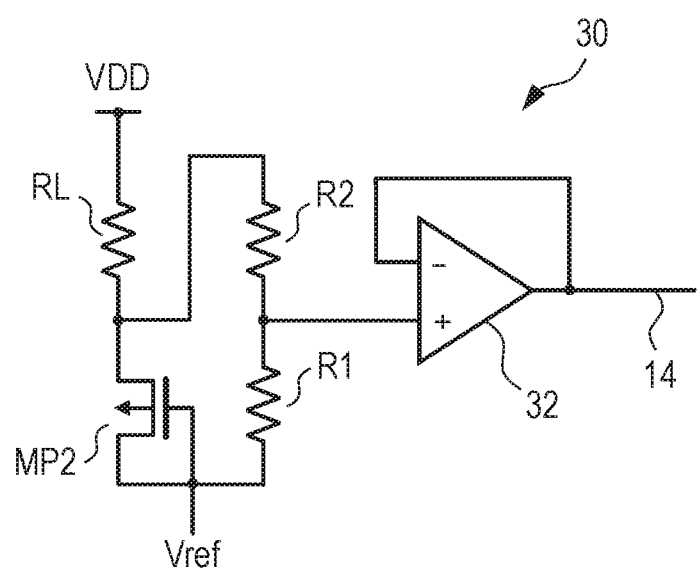
FIG. 2 is a circuit diagram illustrating a configuration example of a voltage supply circuit in the photoelectric conversion device according to the first embodiment of the present invention.
Figure 3:
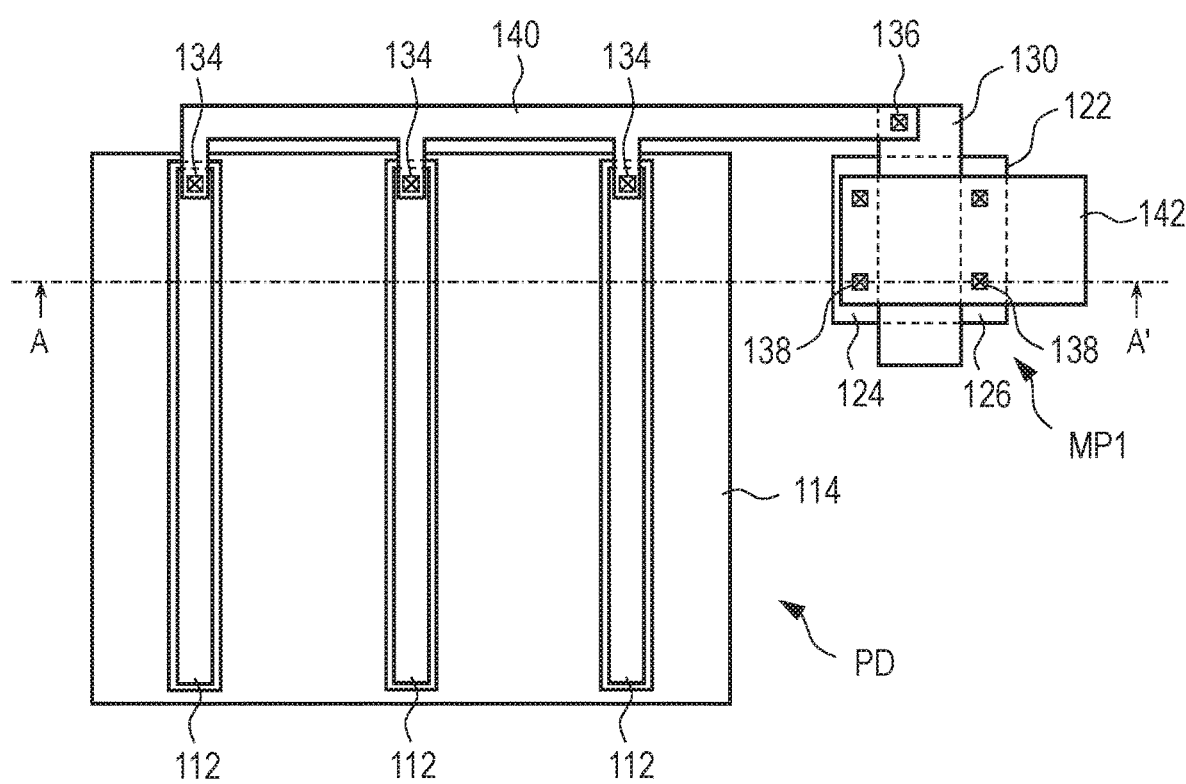
FIG. 3 is a plan view illustrating the structure of a pixel in the photoelectric conversion device according to the first embodiment of the present invention.
Figure 4:
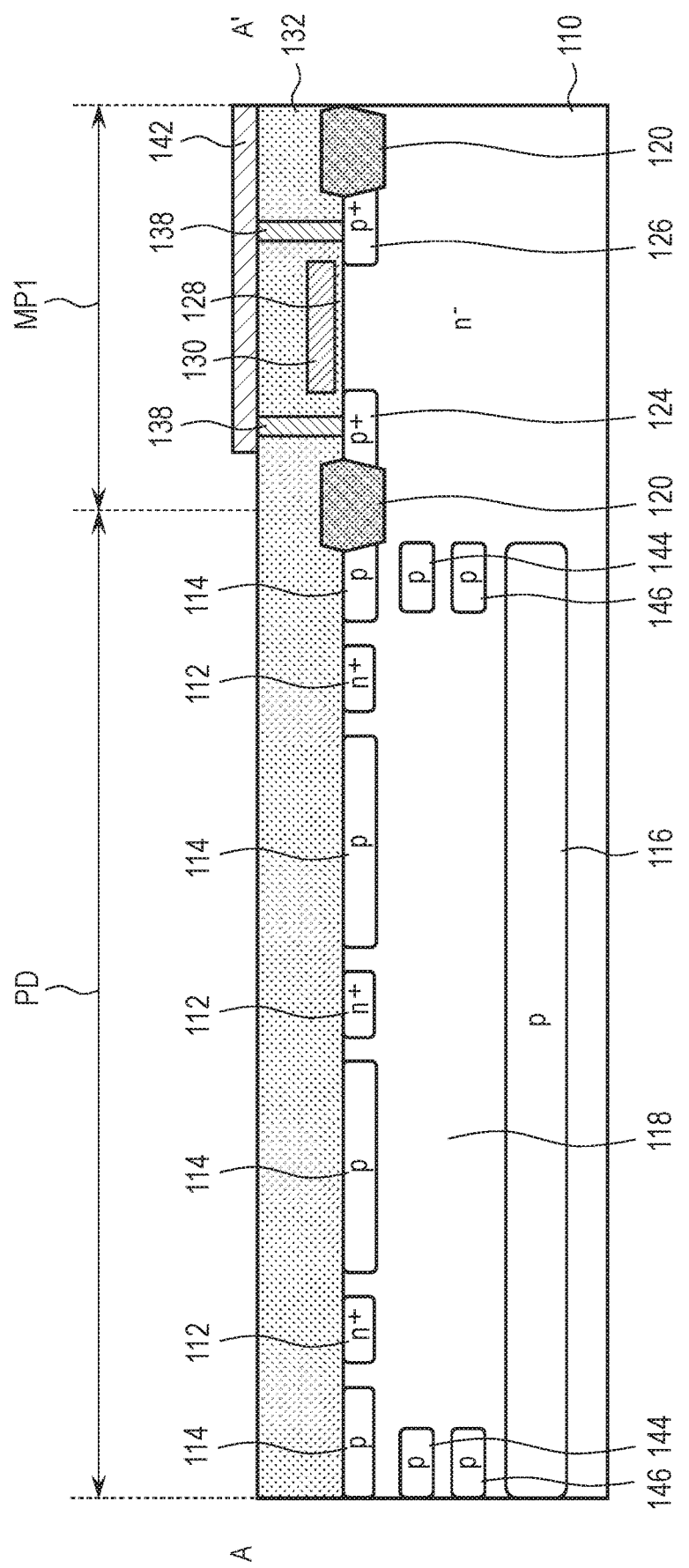
FIG. 4 is a schematic cross-sectional view illustrating the structure of the pixel in the photoelectric conversion device according to the first embodiment of the present invention.

A photoelectric conversion device according to a first embodiment of the present invention will be described with reference to FIG. 1 to FIG. 4. FIG. 1 is a circuit diagram illustrating the general configuration of the photoelectric conversion device according to the present embodiment. FIG. 2 is a circuit diagram illustrating a configuration example of a voltage supply circuit in the photoelectric conversion device according to the present embodiment. FIG. 3 is a plan view illustrating the structure of a pixel in the photoelectric conversion device according to the present embodiment. FIG. 4 is the schematic cross-sectional view illustrating the structure of the pixel in the photoelectric conversion device according to the present embodiment.

First, the general configuration of the photoelectric conversion device according to the present embodiment will be described by using FIG. 1 and FIG. 2.

As illustrated in FIG. 1, a photoelectric conversion device 100 according to the present embodiment includes a plurality of pixels 10, a scanning circuit 20, a voltage supply circuit 30, and an integral circuit 40.

The plurality of pixels 10 can form a pixel array. While three pixels 10 arranged in three rows by one column are illustrated in FIG. 1 to simplify the drawing, the number of the pixels 10 or the arrangement thereof is not particularly limited. For example, the plurality of pixels 10 may be aligned one-dimensionally along a row direction or a column direction or arranged two-dimensionally over a plurality of rows and a plurality of columns.

Each of the pixels 10 is connected to a control line 12 arranged on each row of the pixel array. When the pixels 10 form a pixel array having a plurality of columns, the plurality of pixels 10 arranged on different columns on the same row can be connected to the common control line 12.

Further, each of the pixels 10 is connected to a voltage supply line 14 and a pixel output line 16 arranged on each column of the pixel array. When the pixels 10 form a pixel array having a plurality of rows, as illustrated in FIG. 1, for example, the plurality of pixels 10 arranged on different rows on the same column can be connected to the common voltage supply line 14 and the common pixel output line 16. When the pixels 10 form a pixel array having a plurality of columns, a plurality of voltage supply lines 14 and a plurality of pixel output lines 16 can be provided in association with respective columns.

Each pixel 10 includes a photoelectric converter PD, an n-channel MOS transistor MN1, and a p-channel MOS transistor MP1. The photoelectric converter PD is a photodiode, for example. The anode of the photodiode is connected to a reference voltage node (for example, a ground node). The cathode of the photodiode is connected to the gate of the p-channel MOS transistor MP1 and the source of the n-channel MOS transistor MN1. The source and the drain of the p-channel MOS transistor MP1 are connected to the voltage supply line 14 of a corresponding column. Alternatively, one of the source and the drain of the p-channel MOS transistor MP1 may be connected to the voltage supply line 14 on a corresponding column, and the other may be in a floating state. The gate of the n-channel MOS transistor MN1 is connected to the control line 12 on a corresponding row. The drain of the n-channel MOS transistor MN1 is connected to the pixel output line 16 on a corresponding column.

The control line 12 on each row is connected to the scanning circuit 20. The scanning circuit 20 is a control circuit unit that supplies predetermined control signals to the pixels 10 via the control line 12 at a predetermined timing. The scanning circuit 20 supplies control signals used for signal readout to each pixel 10 sequentially on a row basis via the control line 12.

The pixel output line 16 on each column is connected to the integral circuit 40. The integral circuit 40 includes an operational amplifier 42 and an integration capacitor C. An inverting input terminal (−) of the operational amplifier 42 is connected to the pixel output line 16. A voltage Vref is supplied to a non-inverting input terminal (+) of the operational amplifier 42. The integration capacitor C is connected between the inverting input terminal (−) and the output terminal of the operational amplifier 42.

The voltage supply line 14 on each column is connected to the voltage supply circuit 30. As illustrated in FIG. 2, the voltage supply circuit 30 includes an operational amplifier 32, a load resistor RL, resistors R1 and R2, and a p-channel MOS transistor MP2. Each of the resistors R1 and R2 is a resistor element having a higher resistance than the load resistor RL.

One terminal of the load resistor RL is connected to a power supply voltage node (voltage VDD). The other terminal of the load resistor RL is connected to one terminal of the resistor R2 and the source of the p-channel MOS transistor MP2. The drain and the gate of the p-channel MOS transistor MP2 and one terminal of the resistor R1 are connected to the reference voltage node (voltage Vref). The voltage Vref is the same as the voltage Vref supplied to the non-inverting input terminal (+) of the operational amplifier 42. The other terminal of the resistor R1 and the other terminal of the resistor R2 are connected to the non-inverting input terminal (+) of the operational amplifier 32. In other words, the resistor R1 and the resistor R2 are connected in series between the node of the gate and the drain and the node of the source of the p-channel MOS transistor MP2. Further, a connection node between the resistor R1 and the resistor R2 is connected to the non-inverting input terminal (+) of the operational amplifier 32. The inverting input terminal (−) and the output terminal of the operational amplifier 32 are short-circuited to form a voltage follower circuit. The output terminal of the operational amplifier 32 is connected to the voltage supply line 14.

Parameters of respective elements forming the voltage supply circuit 30 are appropriately set such that the p-channel MOS transistor MP1 switches from an off-state to an on-state in a potential change range where the signal charge accumulation amount of an n-type semiconductor region 112 changes from zero to the saturation charge amount. Note that details of the voltage supply circuit 30 and the n-type semiconductor region 112 will be described below.

Next, the structure of the pixel 10 will be described in more detail by using FIG. 3 and FIG. 4. FIG. 3 is a plan view illustrating a layout example of the photoelectric converter PD and the p-channel MOS transistor MP1 out of the components of the pixel 10 described above. FIG. 4 is a schematic cross-sectional view taken along the line A-A' in FIG. 3.

The photoelectric converter PD and the p-channel MOS transistor MP1 are provided on an n-type semiconductor substrate 110 having a low impurity concentration. Note that, in the present specification, the conductivity type of a semiconductor may be described as a first conductivity type or a second conductivity type. The first conductivity type and the second conductivity type are opposite conductivity types. That is, when the first conductivity type is n-type, the second conductivity type is p-type. When the first conductivity type is p-type, the second conductivity type is n-type.

The photoelectric converter PD includes the n-type semiconductor region 112 and a p-type semiconductor region 114 provided in the surface portion of the n-type semiconductor substrate 110 and a p-type semiconductor region 116 provided in a deep portion of the n-type semiconductor substrate 110.

The n-type semiconductor region 112 functions as a charge accumulation portion that accumulates signal charge (electrons) generated by photoelectric conversion. The p-type semiconductor region 114 is provided in most part of the light receiving region (generally corresponding to a region in which the p-type semiconductor region 116 is provided in a plan view) except the region in which the n-type semiconductor region 112 is provided in a plan view. The p-type semiconductor region 114 forms p-n junction between the p-type semiconductor region 114 and the n-type semiconductor region 112 via a low concentration semiconductor region 118 between the p-type semiconductor region 114 and the n-type semiconductor region 112. The p-type semiconductor region 116 forms p-n junction between the p-type semiconductor region 116 and the n-type semiconductor region 112 via a low concentration semiconductor region 118 between the p-type semiconductor region 116 and the n-type semiconductor region 112. The p-type semiconductor region 116 defines a depth at which signal is generated by photoelectric conversion and also serves as an isolation region for preventing signal charge generated in the photoelectric converter PD from leaking to the adjacent pixel 10. The semiconductor region 118 may be an n-type semiconductor region having a low impurity concentration as with the n-type semiconductor substrate 110 or may be a p-type semiconductor region having a low impurity concentration.

The area (p-n junction area) occupied by the n-type semiconductor region 112 in the entire light receiving region in a plan view is preferably reduced such that the p-n junction capacitance with the p-type semiconductor regions 114 and 116 is reduced as much as possible. For example, the area of the region to which the n-type semiconductor region 112 is provided is set to be smaller than or equal to ½ of the region to which the p-type semiconductor region 116 is provided in a plan view. In FIG. 3, a case where the n-type semiconductor region 112 is formed of a three-stripe-shaped pattern in a plan view is illustrated as an example. It is desirable that the arrangement pattern of the n-type semiconductor region 112 be appropriately set so as not to impair desired sensitivity (see the second embodiment).

P-type semiconductor regions 144 and 146 are provided between the p-type semiconductor region 114 and the p-type semiconductor region 116 in the periphery of the region to which the photoelectric converter PD is provided. The p-type semiconductor regions 144 and 146 electrically connect the p-type semiconductor region 114 and the p-type semiconductor region 116 to each other in a depth direction. A fixed voltage such as the ground voltage is supplied to the anode of the photoelectric converter PD. The fixed voltage supplied to the anode of the photoelectric converter PD is applied to the p-type semiconductor region 114 and is also applied to the p-type semiconductor region 116 via the p-type semiconductor regions 144 and 146. The p-type semiconductor regions 144 and 146 also serve as an isolation region for preventing signal charge generating in the photoelectric converter PD from leaking to other regions in the pixel 10 or another adjacent pixel 10.

The p-channel MOS transistor MP 1 is provided within an active region 122 defined in the surface portion of the n-type semiconductor substrate 110 by an element isolation insulating region 120 such as Shallow Trench Isolation (STI). The p-channel MOS transistor MP1 includes p-type semiconductor regions 124 and 126 forming the source and the drain and a gate electrode 130. The p-type semiconductor regions 124 and 126 are provided in the surface portion of the active region 122 so as to be separated from each other. The gate electrode 130 is provided over the n-type semiconductor substrate 110 between the p-type semiconductor region 124 and the p-type semiconductor region 126 with a gate insulating film 128 interposed therebetween. Note that the p-channel MOS transistor MP1 may be formed inside an n-well provided in the n-type semiconductor substrate 110.

In terms of reducing the gate capacitance as much as possible when the p-channel MOS transistor MP1 is in an off-state, it is desirable that the impurity concentration of the n-type semiconductor substrate 110 (or the n-well) have a low concentration, specifically, a concentration of lower than or equal to $1 \times 10^{17}$ cm$^{-3}$. Further, in terms of increasing the gate capacitance as much as possible when the p-channel MOS transistor MP1 is in an on-state, it is preferable that the gate insulating film 128 is made very thin.

An interlayer insulating film 132 is provided over the n-type semiconductor substrate 110 in which the photoelectric converter PD and the p-channel MOS transistor MP1 are provided. Metal interconnections 140 and 142 are provided over the interlayer insulating film 132. The metal interconnection 140 is connected to the n-type semiconductor region 112 via a conductive member 134 such as a contact plug. Further, the metal interconnection 140 is connected to the gate electrode 130 via a conductive member 136 such as a contact plug. Thereby, the n-type semiconductor region 112 is electrically connected to the gate electrode 130. The metal interconnection 142 is connected to the p-type semiconductor region 124 and the p-type semiconductor region 126 via a conductive member 138 such as a contact plug, respectively. Thereby, the p-type semiconductor region 124 forming the source of the p-channel MOS transistor MP1 is electrically connected to the p-type semiconductor region 126 forming the drain.

Next, the operation of the photoelectric conversion device according to the present embodiment will be described with reference to FIG. 1 to FIG. 4.

Once light enters the pixel 10, the photoelectric converter PD converts (photoelectrically converts) the incident light into amount of charge in accordance with the amount of the incident light. Electrons serving as signal charge of electron-hole pairs generated by photoelectric conversion are accumulated in the n-type semiconductor region 112. In the photoelectric converter PD, while most of the signal charge is generated in the semiconductor region 118, the semiconductor region 118 is basically depleted during a typical signal accumulation period, and therefore the generated signal charge move to and are accumulated in the n-type semiconductor region 112 due to diffusion or drift. Therefore, the light receiving sensitivity is not reduced by the layout of the n-type semiconductor region 112 that is located in only parts of the pixel area as illustrated in FIG. 3.

While the n-type semiconductor region 112 forms p-n junction with the p-type semiconductor regions 114 and 116, the n-type semiconductor region 112 and the p-type semiconductor regions 114 and 116 are arranged so as to maintain a predetermined distance by using the semiconductor region 118. That is, the n-type semiconductor region 112 and the p-type semiconductor regions 114 and 116 form p-n junction holding the depleted semiconductor region 118 therebetween. Furthermore, as illustrated in FIG. 3, the area occupied by the n-type semiconductor region 112 in a plan view is the area of the photoelectric converter PD, that is, only a small part of, practically, half or less the p-type semiconductor region 116. Therefore, the p-n junction capacitance between the n-type semiconductor region 112 and the p-type semiconductor regions 114 and 116 has a sufficiently small value.

Further, in the p-channel MOS transistor MP1, the source and the drain voltages are set such that the p-channel MOS transistor MP1 is controlled to an off-state at a voltage of the n-type semiconductor region 112 in a reset state immediately after readout of signal charge from the photoelectric converter PD is performed. Since the p-channel MOS transistor MP1 here is formed in the n-type semiconductor substrate 110 or in an n-well having a low concentration as described above, a wide depletion layer is formed in the semiconductor layer under the gate electrode 130 in an off-state, and thereby the gate capacitance is significantly reduced. It is therefore possible to suppress kTC noise generated at the reset time of the photoelectric converter PD due to a parasitic capacitance continuous to the n-type semiconductor region 112 to be sufficiently small.

The potential of the n-type semiconductor region 112 decreases as the amount of signal charge accumulated in the n-type semiconductor region 112 increases. When the potential of the n-type semiconductor region 112 is lower than a predetermined potential, the p-channel MOS transistor MP1 is turned on. When the p-channel MOS transistor MP1 is turned on, the surface of the n-type semiconductor substrate 110 immediately under the gate electrode 130 is inverted to p-type to accumulate holes, and thereby the gate electrode 130 is controlled to a state where a large capacitance such as a gate insulating film capacitance is connected. Therefore, while the p-n junction capacitance of the photoelectric converter PD is small, a high saturation charge amount can be ensured by such a large gate capacitance coupled to the n-type semiconductor region 112.

The n-channel MOS transistor MN1 is a switch controlling charge transfer from the photoelectric converter PD to the integral circuit 40. When a control signal used for signal readout is supplied from the scanning circuit 20 via the control line 12, the n-channel MOS transistor MN1 is turned on. This causes the signal charge accumulated in the n-type semiconductor region 112 of the photoelectric converter PD to be transferred to the integral circuit 40 via the n-channel MOS transistor MN1 and the pixel output line 16. The photoelectric converter PD in which readout of signal charge has been performed is controlled to a reset state where no signal charge is accumulated. The integral circuit 40 has a function as a charge-to-voltage converter that outputs a voltage signal corresponding to amount of signal charge accumulated in the n-type semiconductor region 112. The signal charge output from the pixel 10 is integrated by the integration capacitor C and output from a sensor output line 44 as a sensor output signal.

As described above, the amount of signal charge accumulated in the cathode (n-type semiconductor region 112) of the photoelectric converter PD is first accumulation amount, and the gate capacitance of the p-channel MOS transistor MP1 when the p-channel MOS transistor MP1 is in an off-state is a first capacitance value.

When the amount of signal charge accumulated in the n-type semiconductor region 112 is second accumulation amount that is larger than the first accumulation amount, the p-channel MOS transistor MP1 is turned on. The gate capacitance of the p-channel MOS transistor MP1 when the p-channel MOS transistor MP1 is in an on-state is the second capacitance value that is larger than the first capacitance value. At this time, the surface of the n-type semiconductor substrate 110 under the gate electrode 130 is in an inversion state.

To implement such an operation, in the present embodiment, a voltage applied to the source and the drain of the p-channel MOS transistor MP1 is set as described below by the voltage supply circuit 30.

A p-channel MOS transistor MP2 forming the voltage supply circuit 30 has the same structure as the p-channel MOS transistor MP1 forming the pixel 10. That is, the threshold voltage of the p-channel MOS transistor MP2 is the same as the threshold voltage of the p-channel MOS transistor MP1. Note that the structure of a MOS transistor being the same means that parameters defining the characteristics of the MOS transistors, for example, a film thickness of the gate insulating film, a gate length, impurity concentrations in each component, or the like are the same. Since MOS transistors simultaneously formed on the same substrate and configured to have the same element parameters are subjected to manufacturing variation in the same manner, their characteristic values such as threshold voltages can be set to be the same.

The p-channel MOS transistor MP2 has the gate and the drain to which the voltage Vref is supplied and the source to which the voltage VDD is supplied via the load resistor RL. Thereby, the p-channel MOS transistor MP2 is in an on-state, and a source current flows through the load resistor RL. The resistance values of the resistors R1 and R2 are set to be higher than the resistance value of the load resistor RL such that a part of the current flowing through the load resistor RL corresponds to the source current of the p-channel MOS transistor MP2, and the remaining current corresponds to the currents flowing through the resistors R2 and R1.

Here, when the threshold voltage of the p-channel MOS transistor MP2 is Vth (the threshold voltage Vth is a negative voltage), the source voltage of the p-channel MOS transistor MP2 is Vref−Vth+ΔV. The voltage ΔV is a positive voltage value determined by the current characteristics and the source current value of the p-channel MOS transistor MP2. For simplified illustration, it is here assumed that the source current value is sufficiently small, and the voltage ΔV is negligible.

When the resistance values of the resistors R1 and R2 are R1 and R2, respectively, the voltage of the connection node between the resistor R1 and the resistor R2, that is, the non-inverting input terminal of the operational amplifier 32 is Vref−Vth×(R1/(R1+R2)). For example, when the voltage Vref is 1.0 [V], the threshold voltage Vth is −0.8 [V], and R1=R2, the voltage of the voltage supply line 14 is 1.4 [V]. This voltage corresponds to the voltage of the source of the p-channel MOS transistor MP2 obtained when a predetermined voltage is applied to the gate and the drain to cause the p-channel MOS transistor MP2 to be turned on.

The n-type semiconductor region 112 of the photoelectric converter PD starts accumulation of signal charge from a state where the potential is reset to have the voltage Vref (=1.0 [V]). At this time, a gate-source voltage VGS of the p-channel MOS transistor MP1 is VGS=1.0 [V]−1.4 [V]=−0.4 [V]. Since the threshold voltage Vth of the p-channel MOS transistor MP1 is Vth=−0.8 [V], the p-channel MOS transistor MP1 is in an off-state. Therefore, the gate capacitance of the p-channel MOS transistor MP1 is small.

The potential of the n-type semiconductor region 112 decreases as the signal charge amount accumulated in the n-type semiconductor region 112 increases as described above. At this time, for example, when the potential of the n-type semiconductor region 112 is lower than 0.6 V, that is, when the gate-source voltage VGS is lower than the threshold voltage Vth (=−0.8 V), the p-channel MOS transistor MP1 is turned on. Thereby, the gate capacitance of the p-channel MOS transistor MP1 rapidly increases, and the saturation charge amount of the photoelectric converter PD has a sufficiently large value.

While the threshold voltage Vth of the MOS transistors changes also due to variation of manufacturing conditions or an operation temperature, with the same structure of the p-channel MOS transistor MP1 and the p-channel MOS transistor MP2, it is possible to suppress influence due to a change of the threshold voltage Vth.

When a power source that supplies a fixed voltage of 1.4 V is connected to the voltage supply line 14 instead of the voltage supply circuit 30, for example, when the threshold voltage Vth of the p-channel MOS transistor MP1 changes by 0.1 V, the potential range of the p-channel MOS transistor MP1 in an off-state changes by 0.1 V. In this regard, with the use of the voltage supply circuit 30 of the present embodiment, the potential range of the p-channel MOS transistor MP1 in an off-state can be suppress to 0.05 [V] that is half of 0.1 [V].

As described above, the reset noise (kTC noise) is less because of the small capacitance of p-n junction in the PD and the small capacitance of off-state MP1, while the saturation signal is large because of the large capacitance of on-state MP1. Therefore, according to the present embodiment, it is possible to realize a photoelectric conversion device having an improved S/N ratio and an improved dynamic range.

Second Embodiment

Figure 5:
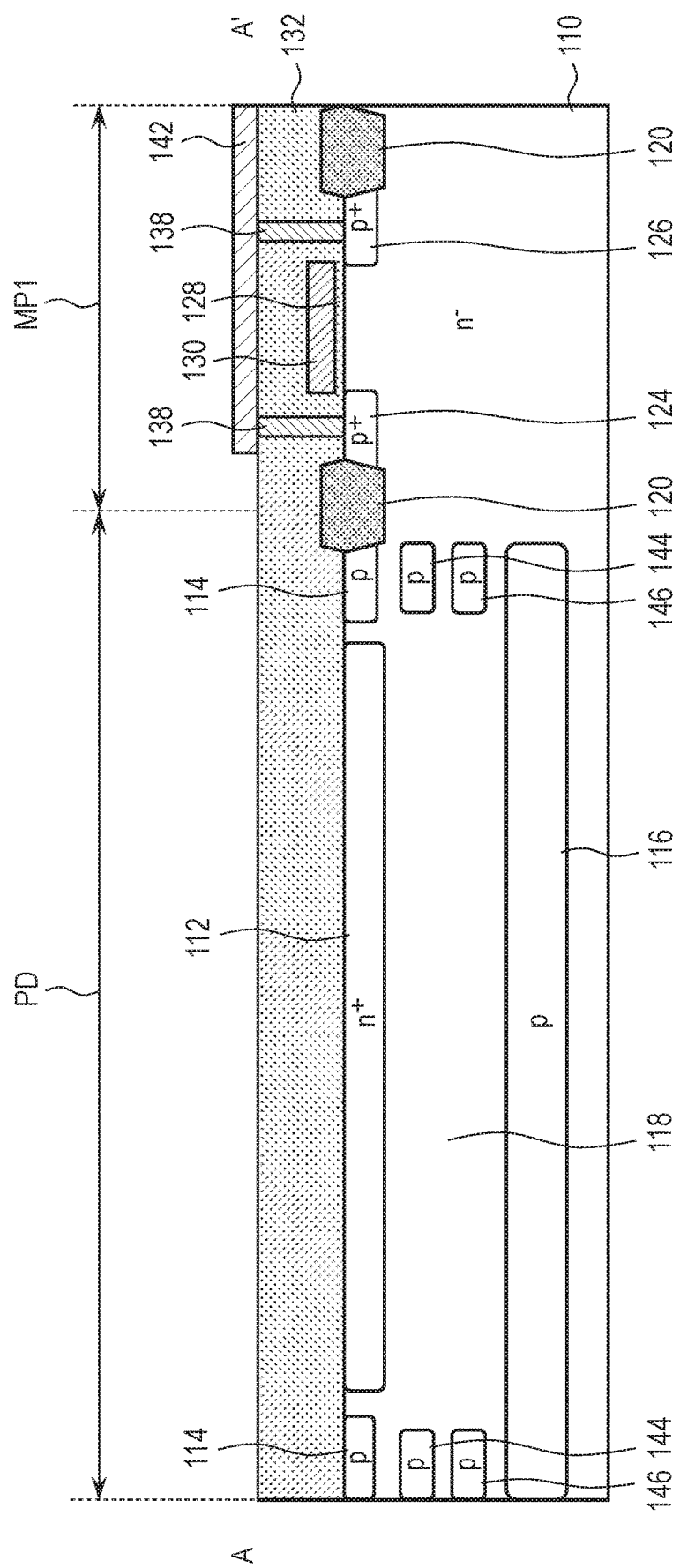
FIG. 5 is a schematic cross-sectional view illustrating the structure of a pixel in a photoelectric conversion device according to a second embodiment of the present invention.

A photoelectric conversion device according to a second embodiment of the present invention will be described with reference to FIG. 5. FIG. 5 is a schematic cross-sectional view illustrating the structure of a pixel in the photoelectric conversion device according to the present embodiment. The same components as those in the photoelectric conversion device according to the first embodiment are labeled with the same reference symbols, and the description thereof will be omitted or simplified.

The photoelectric conversion device according to the present embodiment is the same as the photoelectric conversion device according to the first embodiment except for a difference in the structure of the photoelectric converter PD. That is, as illustrated in FIG. 5, in the photoelectric converter PD of the photoelectric conversion device according to the present embodiment, the n-type semiconductor region 112 forming a charge accumulation portion occupies substantially the entire surface of the light receiving region of the photoelectric converter PD in a plan view.

In the photoelectric conversion device according to the first embodiment, in terms of reducing the p-n junction capacitance of the photoelectric converter PD, the n-type semiconductor region 112 is arranged in a part of the light receiving region of the photoelectric converter PD in a plan view. When the n-type semiconductor region 112 is configured as described above, however, a planar distance to the n-type semiconductor region 112 will be different depending on a location at which signal charge is generated in the semiconductor region 118. While signal charge generated in the semiconductor region 118 eventually reaches the n-type semiconductor region 112 due to diffusion, it is also assumed that a response delay may occur for signal charge generated at a location distant from the n-type semiconductor region 112 in a plan view.

In this regard, in the photoelectric conversion device according to the present embodiment, the n-type semiconductor region 112 is arranged on substantially the entire surface of the light receiving region of the photoelectric converter PD in a plan view. Therefore, signal charge generated within the semiconductor region 118 smoothly moves to the n-type semiconductor region 112 arranged in the substrate surface corresponding to the occurrence location of signal charge, and substantially no delay in light response occurs. Therefore, according to the present embodiment, in the same manner as the first embodiment, it is possible to realize a photoelectric conversion device that enables both a low noise and a high saturation and has a good light response while suppressing influence of manufacturing variation or the like.

Note that an increase of the area of the n-type semiconductor region 112 means an increase of the p-n junction capacitance of the photoelectric converter PD and also causes an increase of kTC noise. Accordingly, when the configuration of the present embodiment is applied, it is desirable to set the impurity concentration of the p-type semiconductor region 116 to a value lower than that of the first embodiment so that substantially the entire surface of the p-type semiconductor region 116 on the side facing the n-type semiconductor region 112 is in a depletion state. Alternatively, it is desirable to form the p-type semiconductor region 116 in a deeper portion of the n-type semiconductor substrate 110 to increase the thickness of the depletion layer between the n-type semiconductor region 112 and the p-type semiconductor region 116. With such a configuration, the p-n junction capacitance formed between the n-type semiconductor region 112 and the p-type semiconductor region 116 can be reduced.

Note that the p-type semiconductor region 116 also serves as a potential barrier used for preventing the signal charge generated in the semiconductor region 118 from leaking toward the n-type semiconductor substrate 110. Therefore, in terms of obtaining desired isolation characteristics, it is desirable to set a lower limit value for the impurity concentration of the p-type semiconductor region 116.

As described above, according to the present embodiment, it is possible to realize a photoelectric conversion device having improved S/N ratio and improved dynamic range.

Third Embodiment

Figure 6:
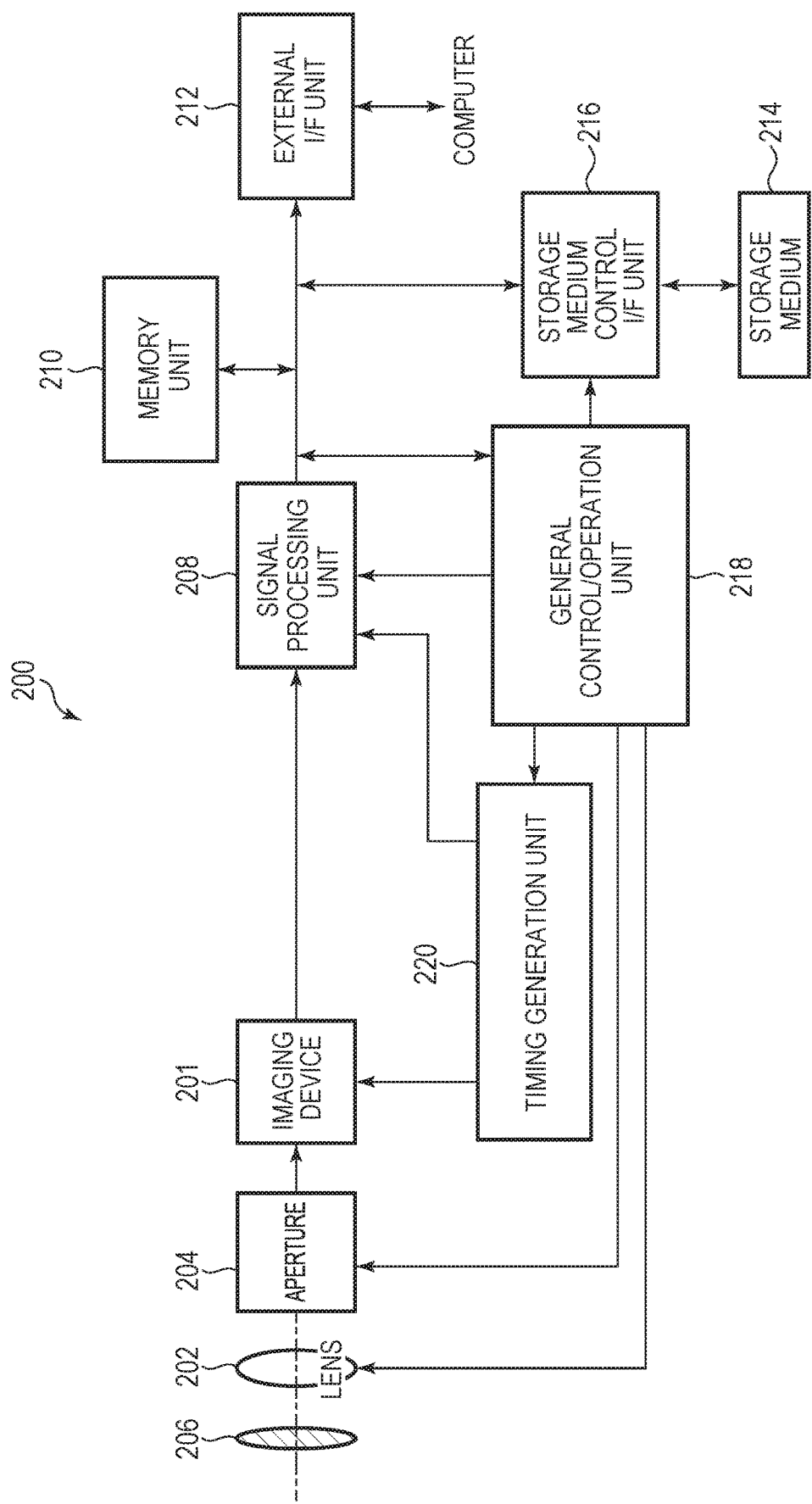
FIG. 6 is a block diagram illustrating the general configuration of an imaging system according to a third embodiment of the present invention.

An imaging system according to a third embodiment of the present invention will be described with reference to FIG. 6. FIG. 6 is a block diagram illustrating the general configuration of the imaging system according to the present embodiment.

The photoelectric conversion device 100 described in the first and second embodiments described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 6 illustrates a block diagram of a digital still camera as an example out of these examples.

The imaging system 200 illustrated as an example in FIG. 6 includes an imaging device 201, a lens 202 that captures an optical image of an object onto the imaging device 201, an aperture 204 for changing light amount passing through the lens 202, and a barrier 206 for protecting the lens 202. The lens 202 and the aperture 204 form an optical system that converges light onto the imaging device 201. The imaging device 201 is the photoelectric conversion device 100 described in any of the first and second embodiments and converts an optical image captured by the lens 202 into image data.

The imaging system 200 further includes a signal processing unit 208 that processes an output signal output from the imaging device 201. The signal processing unit 208 preforms an analog-to-digital (AD) conversion that converts an analog signal output by the imaging device 201 into a digital signal. In addition, the signal processing unit 208 performs various correction and compression other than the above, if necessary, and outputs image data. An AD conversion unit, which is a part of the signal processing unit 208, may be formed on a semiconductor substrate on which the imaging device 201 is provided or a semiconductor substrate on which the imaging device 201 is not provided. Further, the imaging device 201 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that controls various operations and the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As discussed above, according to the present embodiment, the imaging system to which the photoelectric conversion device 100 according to the first and second embodiments is applied can be implemented.

Fourth Embodiment

Figure 7A:
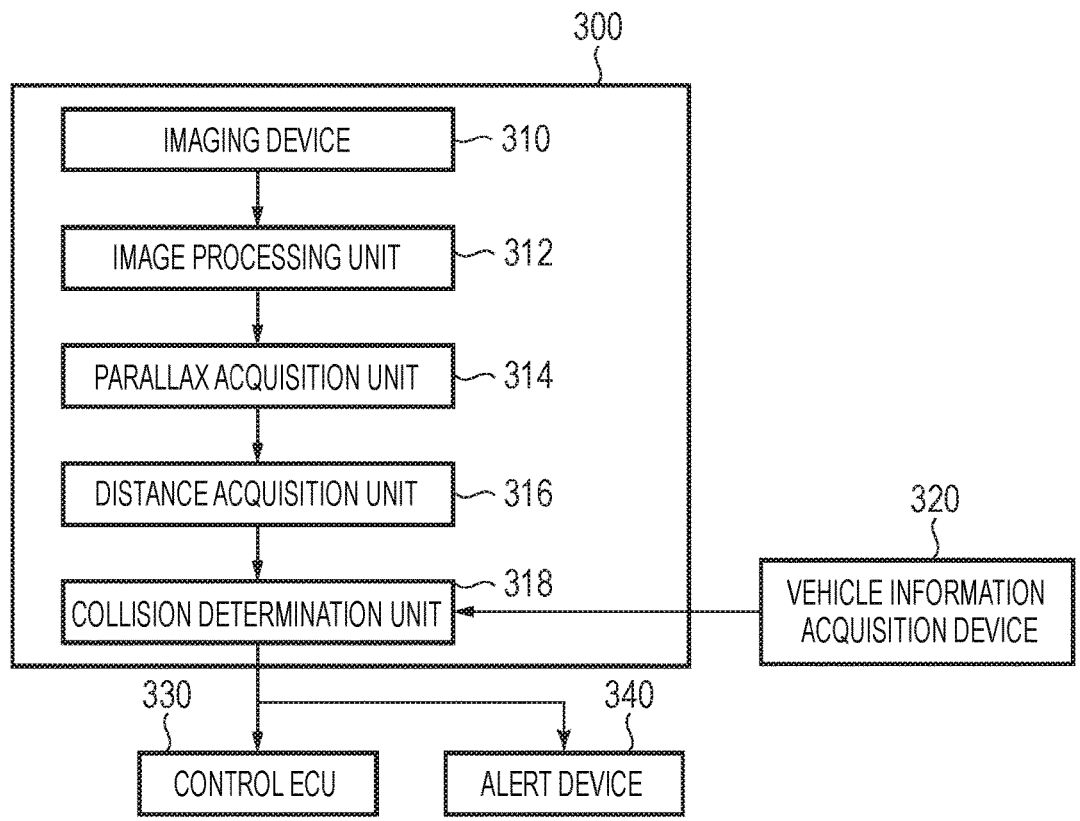
FIG. 7A is a diagram illustrating a configuration example of an imaging system according to a fourth embodiment of the present invention.
Figure 7B:
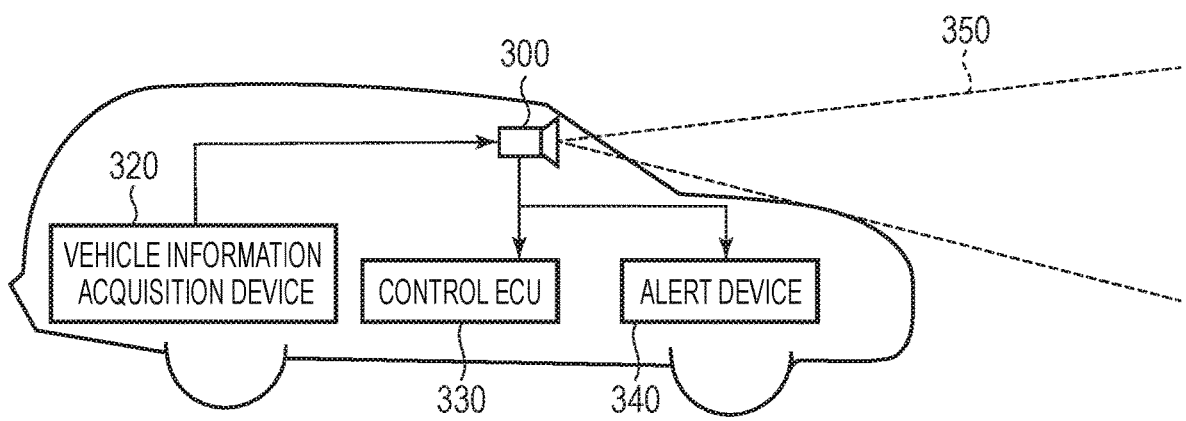
FIG. 7B is a diagram illustrating a configuration example of a movable object according to the fourth embodiment of the present invention.

An imaging system and a movable object according to a fourth embodiment of the present invention will be described by using FIG. 7A and FIG. 7B. FIG. 7A is a diagram illustrating a configuration of an imaging system according to the present embodiment. FIG. 7B is a diagram illustrating a configuration of a movable object according to the present embodiment.

FIG. 7A illustrates an example of an imaging system related to an on-vehicle camera. The imaging system 300 includes an imaging device 310. The imaging device 310 is the photoelectric conversion device 100 described in any of the first and second embodiments described above. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 7B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

MODIFIED EMBODIMENTS

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, while the photoelectric conversion device that utilizes electrons as signal charge has been illustrated as an example in the first and second embodiments described above, signal charge is not necessarily required to be electrons, and holes may be used as signal charge. In such a case, the conductivity type of each semiconductor region forming a photodiode or a MOS transistor or the conductivity type of the MOS transistors is the conductivity type opposite to those described in the embodiments described above.

Further, while the MOS transistors have been illustrated as a transistor forming the pixel 10 and the voltage supply circuit 30 in the first and second embodiments described above, an insulated gate field effect transistor may be used, and it is not necessarily required to be a MOS transistor.

Further, the configuration of the pixel 10 illustrated in the first and second embodiments described above is not limited to that has been illustrated. The pixel 10 may include, for example, a charge holding portion that holds signal charge transferred from the photoelectric converter PD, an amplifier unit (source follower circuit) that outputs a voltage in accordance with charge amount held by the charge holding portion, a select transistor that selects the pixel 10, or the like.

Further, the imaging systems illustrated in the third and fourth embodiments described above are examples of an imaging system to which the photoelectric conversion device of the present invention may be applied, and an imaging system to which the photoelectric conversion device of the present invention can be applied is not limited to the configuration illustrated in FIG. 6 and FIG. 7A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-153476, filed Aug. 17, 2018, which is hereby incorporated by reference herein in its entirety.

What is claimed is:

1. A photoelectric conversion device comprising:
a photoelectric converter that includes
a first semiconductor region of a first conductivity type, and
a second semiconductor region of a second conductivity type and accumulates signal charge generated by photoelectric conversion in the first semiconductor region;
a charge-to-voltage converter that generates voltage signal in accordance with amount of the signal charge accumulated in the first semiconductor region;
a first transistor of the second conductivity type that is provided in a third semiconductor region of the first conductivity type and includes a gate connected to the first semiconductor region; and
a voltage supply circuit that supplies voltage to at least one of a source and a drain of the first transistor,
wherein the voltage supply circuit supplies, to at least the one of the source and the drain, a voltage that causes gate capacitance of the first transistor to be first capacitance value when the signal charge accumulated in the first semiconductor region correspond to first accumulation amount and causes the gate capacitance to be a second capacitance value larger than the first capacitance value when the signal charge accumulated in the first semiconductor region correspond to second accumulation amount larger than the first accumulation amount.

2. The photoelectric conversion device according to claim 1, wherein the voltage supply circuit includes a second transistor having the same structure as the first transistor and outputs a voltage in accordance with a source voltage obtained when a predetermined voltage is applied to the gate and the drain of the second transistor to turn on the second transistor.

3. The photoelectric conversion device according to claim 2, wherein the voltage supply circuit further includes
a first resistor and a second resistor connected in series between the gate and the drain, and the source of the second transistor,
a third resistor having one node connected to the source of the second transistor, and
an operational amplifier forming a voltage follower circuit and including a non-inverting input node connected to a connection node between the first resistor and the second resistor,
wherein a power supply voltage is supplied to the other node of the third resistor,
wherein a reference voltage is supplied to the gate and the drain of the second transistor, and
wherein the voltage is supplied from an output node of the operational amplifier to at least one of the source and the drain of the first transistor.

4. The photoelectric conversion device according to claim 3, wherein a surface of the third semiconductor region under the gate is in a depletion state when the signal charge accumulated in the first semiconductor region correspond to the first accumulation amount.

5. The photoelectric conversion device according to claim 3, wherein a surface of the third semiconductor region under the gate is in an inversion state when the signal charge accumulated in the first semiconductor region correspond to the second accumulation amount.

6. The photoelectric conversion device according to claim 3 further comprising a switch provided between the first semiconductor region and the charge-to-voltage converter and configured to control charge transfer from the first semiconductor region to the charge-to-voltage converter.

7. The photoelectric conversion device according to claim 2, wherein a surface of the third semiconductor region under the gate is in a depletion state when the signal charge accumulated in the first semiconductor region correspond to the first accumulation amount.

8. The photoelectric conversion device according to claim 2, wherein a surface of the third semiconductor region under the gate is in an inversion state when the signal charge accumulated in the first semiconductor region correspond to the second accumulation amount.

9. The photoelectric conversion device according to claim 2 further comprising a switch provided between the first semiconductor region and the charge-to-voltage converter and configured to control charge transfer from the first semiconductor region to the charge-to-voltage converter.

10. The photoelectric conversion device according to claim 1, wherein a surface of the third semiconductor region under the gate is in a depletion state when the signal charge accumulated in the first semiconductor region correspond to the first accumulation amount.

11. The photoelectric conversion device according to claim 1, wherein a surface of the third semiconductor region under the gate is in an inversion state when the signal charge accumulated in the first semiconductor region correspond to the second accumulation amount.

12. The photoelectric conversion device according to claim 1, wherein an impurity concentration of a surface of the third semiconductor region under the gate is lower than or equal to $1 \times 10^{17}$ cm$^{-3}$.

13. The photoelectric conversion device according to claim 1, wherein a fixed voltage is supplied to the second semiconductor region.

14. The photoelectric conversion device according to claim 1, wherein the charge-to-voltage converter includes an integral circuit.

15. The photoelectric conversion device according to claim 1 further comprising a switch provided between the first semiconductor region and the charge-to-voltage converter and configured to control charge transfer from the first semiconductor region to the charge-to-voltage converter.

16. The photoelectric conversion device according to claim 1, wherein the area of the first semiconductor region in a plan view is smaller than or equal to a half the area of the second semiconductor region in a plan view.

17. The photoelectric conversion device according to claim 1, wherein the second semiconductor region is depleted.

18. An imaging system comprising:
the photoelectric conversion device according to claim 1; and
a signal processing unit processing signals output from the photoelectric conversion device.

19. A movable object comprising:
the photoelectric conversion device according to claim 1;
a distance information acquisition unit that acquires distance information on a distance to an object, from a parallax image based on signals output from the photoelectric conversion device; and
a control unit that controls the movable object based on the distance information.

* * * * *